(12) United States Patent
Shin et al.

(10) Patent No.: US 12,060,649 B2
(45) Date of Patent: Aug. 13, 2024

(54) RAW MATERIAL SUPPLY UNIT, SINGLE-CRYSTAL SILICON INGOT GROWING APPARATUS COMPRISING SAME AND RAW MATERIAL SUPPLY METHOD

(71) Applicant: SK SILTRON CO., LTD., Gyeongsangbuk-do (KR)

(72) Inventors: Yun Gwang Shin, Gyeongsangbuk-do (KR); Young Jung Lee, Gyeongsangbuk-do (KR)

(73) Assignee: SK SILTRON CO., LTD., Gyeongsangbuk-do (KR)

( * ) Notice: Subject to any disclaimer, the term of this patent is extended or adjusted under 35 U.S.C. 154(b) by 147 days.

(21) Appl. No.: 17/771,054

(22) PCT Filed: Feb. 13, 2020

(86) PCT No.: PCT/KR2020/002043
§ 371 (c)(1),
(2) Date: Apr. 22, 2022

(87) PCT Pub. No.: WO2021/080094
PCT Pub. Date: Apr. 29, 2021

(65) Prior Publication Data
US 2022/0372650 A1 Nov. 24, 2022

(30) Foreign Application Priority Data
Oct. 22, 2019 (KR) .......................... 10-2019-0131173

(51) Int. Cl.
*C30B 15/02* (2006.01)
*C30B 29/06* (2006.01)

(52) U.S. Cl.
CPC .............. *C30B 15/02* (2013.01); *C30B 29/06* (2013.01); *Y10T 117/1056* (2015.01)

(58) Field of Classification Search
CPC ..................................................... C30B 29/06
See application file for complete search history.

(56) References Cited

U.S. PATENT DOCUMENTS

| 4,949,940 A | 8/1990 | Weber |
| 2010/0064965 A1* | 3/2010 | Muehe .................. C30B 15/30 117/35 |

(Continued)

FOREIGN PATENT DOCUMENTS

| CN | 1671891 | 9/2005 |
| CN | 101135061 | 3/2008 |

(Continued)

OTHER PUBLICATIONS

International Search Report dated Jul. 21, 2020 issued in Application No. PCT/KR2020/002043.

(Continued)

*Primary Examiner* — Hua Qi
(74) *Attorney, Agent, or Firm* — KED & Associates LLP

(57) ABSTRACT

Provided is a raw material supply unit comprising: a body having a space filled with a raw material; a partition for dividing the body, in the longitudinal direction, into at least two areas; at least two valves each provided in the respective areas in the body divided by the partition so as to open/close the lower portion of the body; and a drive unit for raising, in the vertical direction, each of the valves independently of each other.

5 Claims, 13 Drawing Sheets

(56) References Cited

U.S. PATENT DOCUMENTS

2012/0160156 A1* 6/2012 Kato .................. C30B 29/06
                                                    117/33
2014/0360428 A1* 12/2014 Jang .................. C30B 15/02
                                                    117/214

FOREIGN PATENT DOCUMENTS

| CN | 102534755 | 7/2012 |
| CN | 106894082 | 6/2017 |
| JP | 2007-204306 | 8/2007 |
| JP | 2008-087998 | 4/2008 |
| KR | 10-2005-0101564 | 10/2005 |
| KR | 10-2005-0120707 | 12/2005 |
| KR | 10-2012-0122563 | 11/2012 |
| KR | 10-1255891 | 4/2013 |
| KR | 10-1820681 | 1/2018 |

OTHER PUBLICATIONS

Chinese Office Action dated Mar. 28, 2023 issued in Application No. 202080074412.3.

* cited by examiner

RAW MATERIAL SUPPLY UNIT, SINGLE-CRYSTAL SILICON INGOT GROWING APPARATUS COMPRISING SAME AND RAW MATERIAL SUPPLY METHOD

CROSS-REFERENCE TO RELATED PATENT APPLICATIONS

This application is a U.S. National Stage Application under 35 U.S.C. § 371 of PCT Application No. PCT/KR2020/002043, filed Feb. 13, 2020, which claims priority to Korean Patent Application No. 10-2019-0131173, filed Oct. 22, 2019, whose entire disclosures are hereby incorporated by reference.

TECHNICAL FIELD

Embodiments relate to a raw material supply unit, a single-crystal silicon ingot growth apparatus including the same, and a raw material supply method, and more particularly to a raw material supply unit capable of evenly supplying a raw material to a crucible of a single-crystal silicon ingot growth apparatus, thereby shortening process time and securing process stability, and a single-crystal silicon ingot growth apparatus including the same.

BACKGROUND ART

A substrate used to manufacture a semiconductor device, a solar cell, etc. is mainly a single-crystal wafer. In particular, a single-crystal silicon wafer is widely used. The single-crystal wafer is generally manufactured by growing a single-crystal ingot from a seed and slicing the single-crystal ingot.

As shown in FIG. 1, a single-crystal growth apparatus for manufacturing a single-crystal ingot includes a crucible 20, into which a polycrystalline raw material S is introduced so as to be melted, and a heating unit 30 configured to heat the crucible 20 such that the raw material S is melted into silicon melt L, and a raw material supply unit is provided above the crucible 20.

In the raw material supply unit, a body 10 having a space defined therein may be filled with the raw material S, such as polysilicon, and a valve 40 is provided under a rod 50 so as to open and close a lower part of the body 10. The body 10 may be used when the raw material S is initially introduced into the crucible 20, and may also be used when the crucible 20 containing the silicon melt L is refilled with a raw material S. Consequently, the raw material supply unit may be called a filling apparatus.

In order to supply the raw material S to the crucible 20, the body 10 may be moved downwards by a pulling-up means (not shown) so as to be adjacent to the crucible 20.

However, the conventional raw material supply unit has the following problems.

As shown in FIG. 1, the valve 40 is provided under the body 10. When the valve 40 is moved downwards, the raw material S may be injected in a direction toward the silicon melt L in the crucible 20 through a space between the valve 40 and the main body 10.

At this time, when the size of the body 10 is increased, the amount of the raw material S in the body is increased, whereby a large amount of the raw material S may be supplied to the crucible 20 at once. However, when the valve 40 under the body 10 is opened and a large amount of the raw material S is supplied to the silicon melt L in the crucible 20 at once, the silicon melt L may splash at the surface thereof.

In order to prevent such a splashing phenomenon, a method of closing the valve 40 under the body 10 during supply of the raw material S may be considered. However, the raw material S may collide with the lower surface of the body 10 and the valve 40 therebetween, whereby the body 10 and the valve 40 may be broken.

Consequently, a process of completely supplying a raw material S to the crucible 20 using a body 10 having a relatively small inner volume, filling the body 10 with a raw material S, and supplying the raw material S to the crucible 20 may be repeatedly performed several times.

In a polycrystalline silicon ingot growth process, therefore, polysilicon injected into the crucible as the raw material S is melted, the raw material supply unit is refilled with polysilicon, and the polysilicon is supplied to the crucible again, whereby the process may be complicated and process time may be lengthened.

DISCLOSURE

Technical Problem

Embodiments simplify a process of supplying a raw material to a crucible in a single-crystal silicon ingot growth apparatus and shorten process time.

Technical Solution

An embodiment provides a raw material supply unit including a body having a space configured to be filled with a raw material, a partition configured to divide the body into at least two regions in a longitudinal direction, at least two valves provided in the regions of the body divided by the partition, the at least two valves being configured to open and close a lower part of the body, and a driving unit configured to independently move the respective valves in an upward-downward direction.

The driving unit may include rods connected to the respective valves and rotary drums provided above the rods.

Each of the valves may form a part of a conical shape, and each of the rods may be connected to an upper part of a corresponding one of the valves.

A region in which each of the rods and a corresponding one of the valves are connected to each other may be adjacent to the center of the body in a lateral direction.

Each of the valves may include a bottom surface and an inclined surface, the inclined surface may be inclined from the region adjacent to the center of the body in the lateral direction toward the bottom surface of the valve, and the region in which each of the rods and a corresponding one of the valves are connected to each other may be an upper region of the inclined surface.

The valve may include a bottom surface, an upper surface, an inclined surface configured to connect outsides of the bottom surface and the upper surface to each other, and an inside surface configured to connect insides of the bottom surface and the upper surface to each other, the area of the upper surface of the valve may be less than the width of the bottom surface, and each of the rods may be connected to the upper surface of the valve.

Each of the bottom surface and the upper surface of each valve may have a fan shape, and a vertex of the fan shape may be adjacent to the center of the body in the lateral direction.

The at least two valves are disposed in symmetry with respect to the center of the body in the lateral direction.

The partition may divide the body into four regions, a first valve and a third valve may be provided in a first region and a third region that face each other, respectively, and a second valve and a fourth valve may be provided in a second region and a fourth region that are disposed between the first region and the third region so as to face each other, respectively.

A first rotary drum having a first connection end connected to a first rod connected to the first valve wound therearound and a third rotary drum having a third connection end connected to the third valve wound therearound may equally move the first rod and a third rod upwards and downwards.

A second rotary drum having a second connection end connected to the second valve wound therearound and a fourth rotary drum having a fourth connection end connected to the fourth valve wound therearound may equally move a second rod and a fourth rod upwards and downwards.

Another embodiment provides a single-crystal silicon ingot growth apparatus including a chamber, a crucible provided in the chamber, the crucible being configured to receive silicon melt, a heating unit configured to heat the crucible, a heat shielding material provided above the crucible, a magnetic field generator configured to apply a magnetic field to the crucible, a rotary shaft configured to rotate the crucible so as to be moved upwards, and the raw material supply unit provided above the crucible.

A further embodiment provides a raw material supply method including filling a crucible with polysilicon and melting the polysilicon, disposing a raw material supply unit having polysilicon injected thereinto above the crucible filled with silicon melt, supplying the polysilicon to the crucible through a first region of a lower surface of the raw material supply unit, melting the polysilicon supplied to the crucible while rotating the crucible, and supplying the polysilicon to the crucible through a second region of the lower surface of the raw material supply unit.

The first region and the second region may be provided in symmetry with respect to the center of the lower surface of the raw material supply unit.

In the step of supplying the polysilicon to the crucible through the second region of the lower surface of the raw material supply unit, the crucible may be moved downwards.

The lower surface of the raw material supply unit may further include a third region facing the first region with respect to the center, and in the step of supplying the polysilicon to the crucible through the first region of the lower surface of the raw material supply unit, the polysilicon may also be supplied to the crucible through the third region of the lower surface of the raw material supply unit.

The lower surface of the raw material supply unit may further include a fourth region facing the second region with respect to the center, and in the step of supplying the polysilicon to the crucible through the second region of the lower surface of the raw material supply unit, the polysilicon may also be supplied to the crucible through the fourth region of the lower surface of the raw material supply unit.

Advantageous Effects

In a raw material supply unit according to an embodiment and a single-crystal silicon ingot growth apparatus and method including the same, the interior of a body may be divided in a longitudinal direction, and polysilicon may be supplied in a direction toward a crucible for each divided region.

Consequently, a raw material may be supplied through some regions and then the raw material may be supplied through other regions using a body having a larger volume than before, whereby the raw material supply unit may not be replaced during supply of the raw material or the raw material supply unit may not be refilled with a raw material, and therefore a raw material supply process may be simplified and process time may be shortened.

BEST MODE

Embodiments will be described in order to specifically explain the present disclosure, and the embodiments will be described in detail with reference to the accompanying drawings for assisting in understanding of the present disclosure.

However, embodiments of the present disclosure may be modified in various different forms, and the scope of the present disclosure is not limited to the following embodiments. Embodiments of the present disclosure are provided merely to more completely explain the present disclosure to a person having average knowledge in the art to which the present disclosure pertains.

In addition, relational terms, such as "first," "second," "above," and "under," may be used only to distinguish between one subject or element and another subject or element without necessarily requiring or involving any physical or logical relationship or sequence between such subjects or elements.

Figure 1:
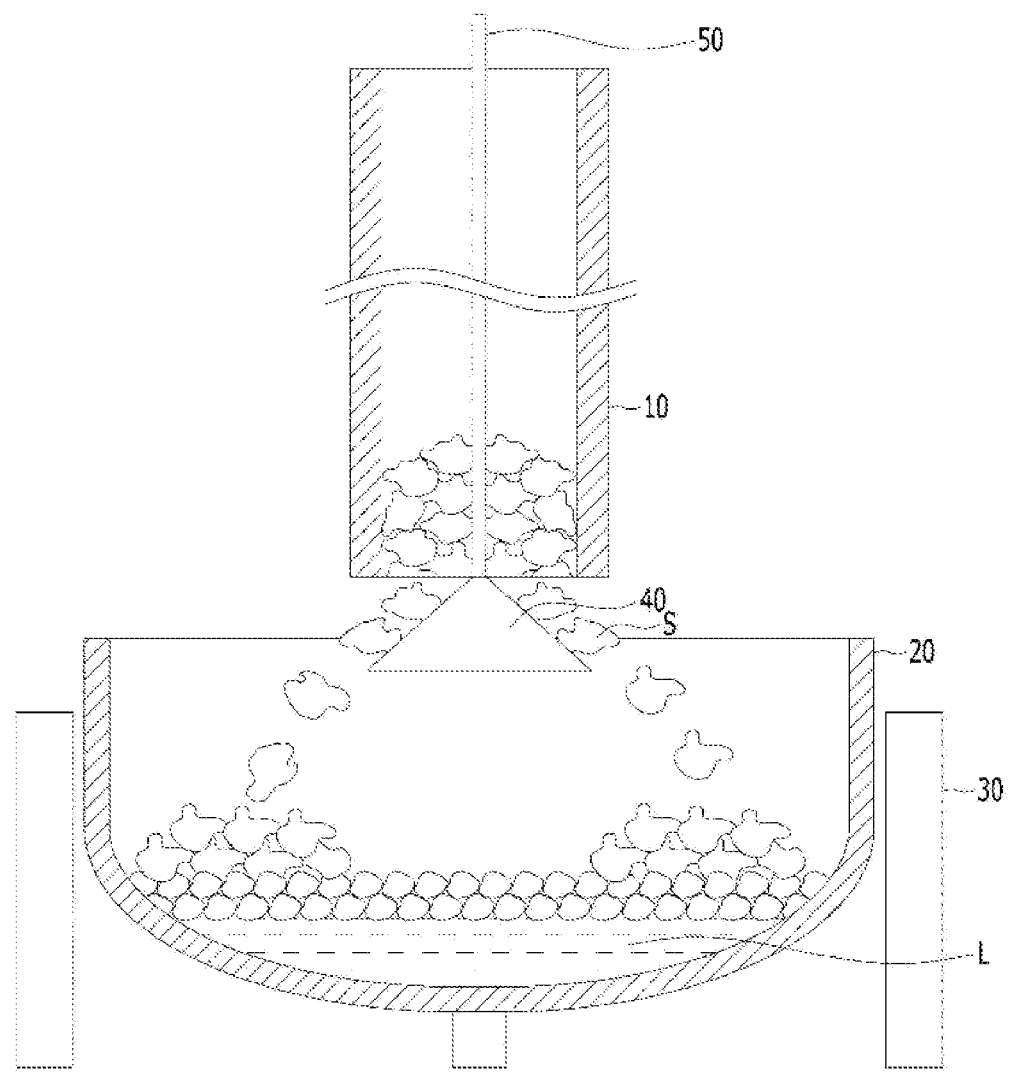
FIG. 1 is a view showing a conventional raw material supply unit and a conventional single-crystal silicon ingot growth apparatus.
Figure 2:
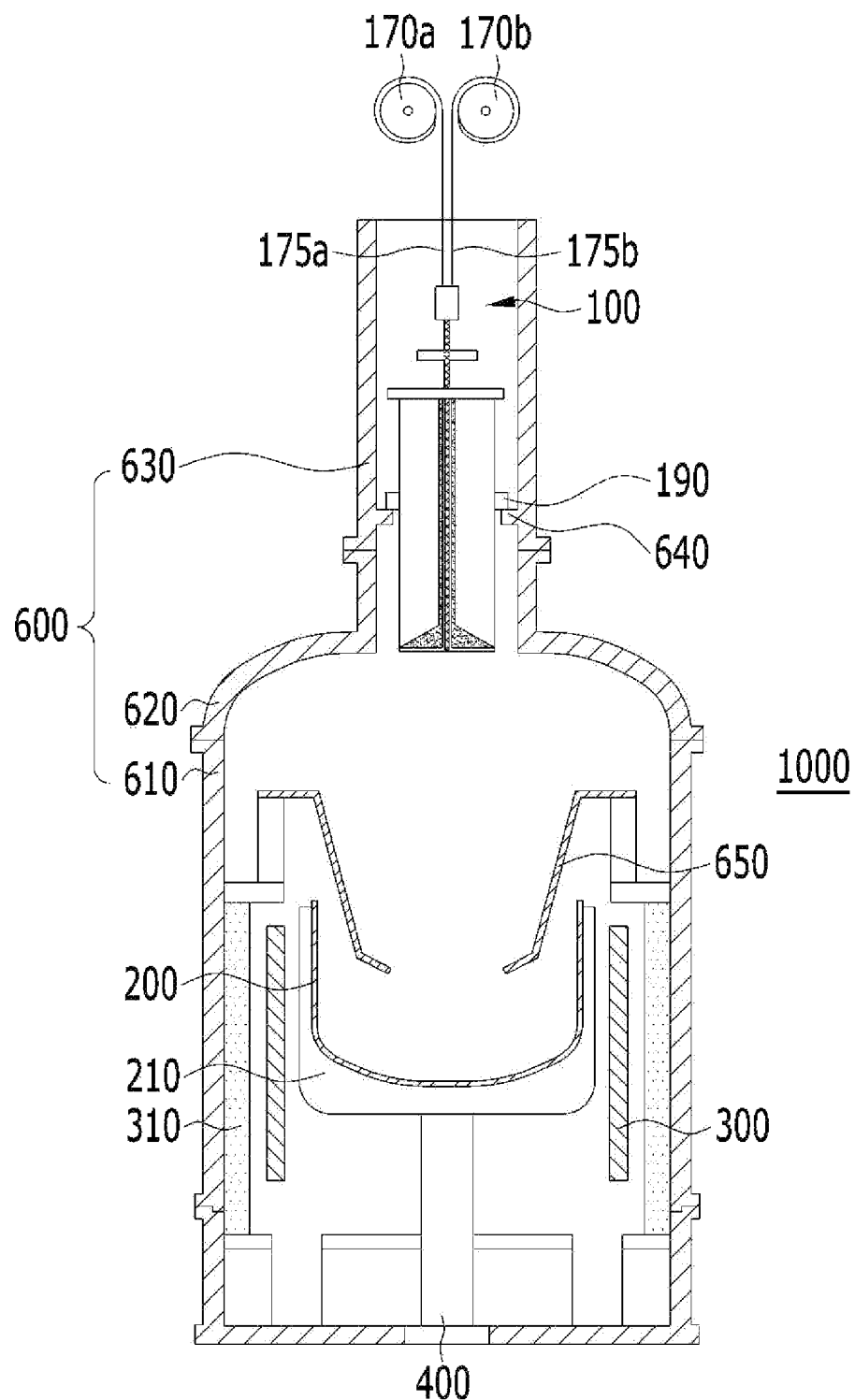
FIG. 2 is a view showing an embodiment of a single-crystal silicon ingot growth apparatus according to the present disclosure.

FIG. 2 is a view showing an embodiment of a single-crystal silicon ingot growth apparatus according to the present disclosure. Hereinafter, the embodiment of the single-crystal silicon ingot growth apparatus according to the present disclosure will be described with reference to FIG. 2.

The single-crystal silicon ingot growth apparatus 1000 according to this embodiment may include a chamber 600, a crucible 200 provided in the chamber 600, the crucible being configured to receive silicon melt, a heating unit 300 configured to heat the crucible 200, a heat shielding material 650 provided above the crucible 200, a magnetic field generator (not shown) configured to apply a magnetic field to the crucible 200, a rotary shaft 400 configured to rotate the crucible 200 so as to be moved upwards or downwards, and a raw material supply unit 100 provided above the crucible 200.

The chamber 600 may include a body chamber 610, a dome chamber 620, and a pull chamber 630 depending on coupling positions thereof.

The crucible 200 may be installed in the body chamber 610, and the dome chamber 620 may form a cover at an upper end of the body chamber 610. Each of the body chamber 610 and the dome chamber 620, which is a place that provides an environment necessary to grow a polysilicon raw material into a single-crystal silicon ingot, may be a cylinder having a receiving space therein. The pull chamber 630 may be located at an upper end of the dome chamber 620, and may be a space in which the grown single-crystal silicon ingot is pulled up.

The chamber 600 may have a support protrusion 640 protruding from an inner wall thereof in a horizontal direction and a heat shielding material 650 provided above the crucible 200. For example, the support protrusion 640 may protrude from an inner wall of the pull chamber 630 in the horizontal direction. The support protrusion 640 may support a catching protrusion 190 of the raw material supply unit 100.

After the catching protrusion 190 of the raw material supply unit 100 is supported by the support protrusion 640 of the chamber 600, a valve may be moved downwards by a pulling-up means 500, and a lower part of a body of the raw material supply unit 100 may be gradually opened.

The crucible 200 may be disposed in the body chamber 610, and may be supported by a crucible support 210 located under the crucible 200. The crucible 200 may have a structure that is rotatable while being filled with a raw material. The heating unit 300 may be disposed in the body chamber 610 so as to be spaced apart from an outer circumferential surface of the crucible 200. When the crucible 200 is heated by the heating unit 300, the raw material in the crucible 200 may be changed into silicon melt.

A heat insulator 310 may be installed between the heating unit 300 and an inner wall of the body chamber 610, and may prevent heat of the heating unit 300 from leaking out of the body chamber 610.

First and second rotary drums 170a and 170b constituting a driving unit of the raw material supply unit 100 may be provided above the pull chamber 630, and first and second connection ends 175a and 175b of the first and second rotary drums 170a and 170b may be connected to first and second rods of the raw material supply unit 100, respectively. Here, each of the first and second connection ends 175a and 175b may be of a cable type or a shaft type. The first and second rotary drums 170a and 170b may move first and second valves connected to the first and second connection ends 175a and 175b upwards or downwards using a motor (not shown). At this time, the motor may separately drive the first and second rotary drums 170a and 170b such that the first and second valves can be independently moved upwards and downwards.

After the supply of the raw material is finished and the raw material supply unit 100 is separated from the chamber 600, a seed may be connected to a seed chuck for single-crystal growth.

Figure 3:
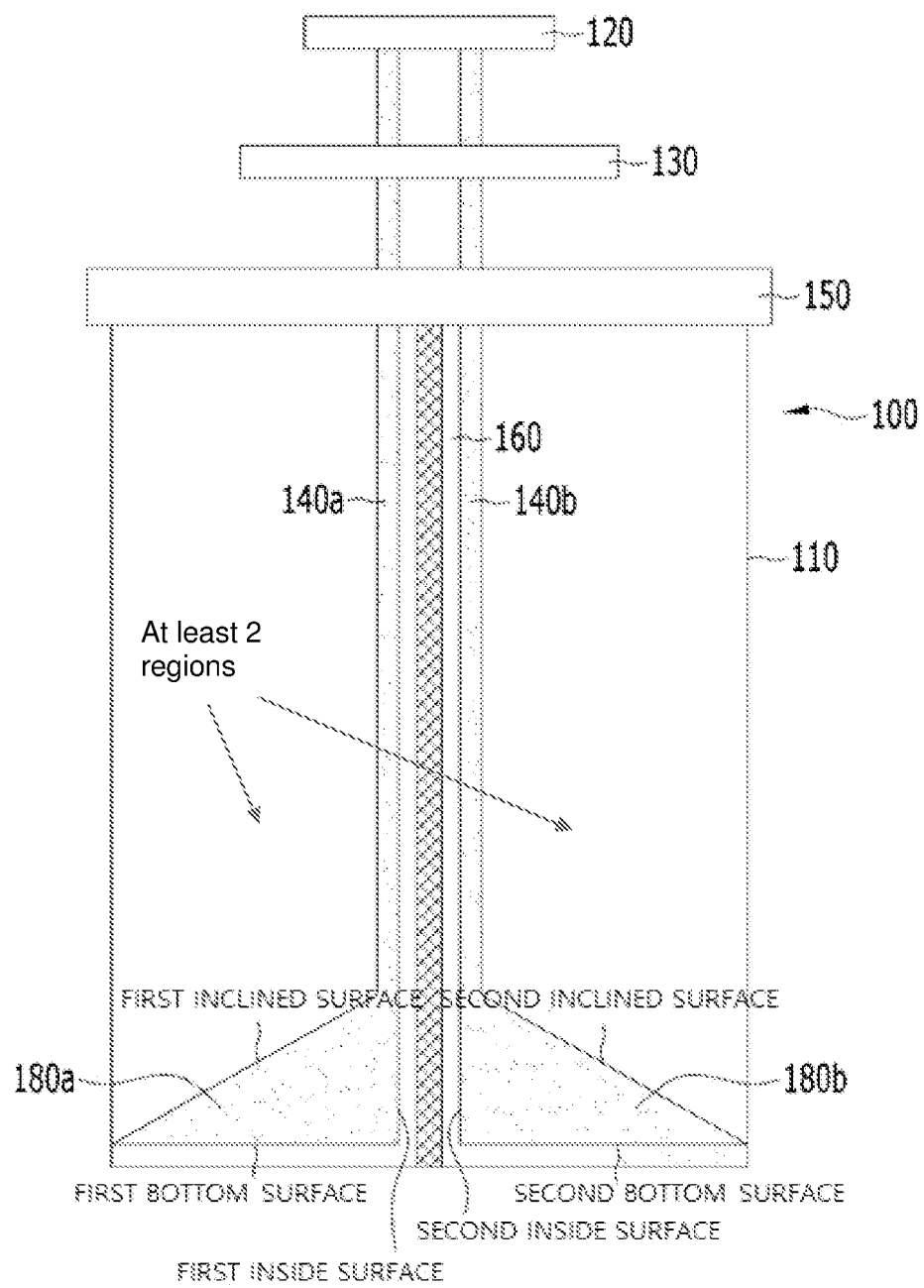
FIG. 3 is a view showing a first embodiment of a raw material supply unit.

FIG. 3 is a view showing a first embodiment of the raw material supply unit. Hereinafter, the first embodiment of the raw material supply unit will be described with reference to FIG. 3.

The raw material supply unit 100 according to the embodiment may include a body 110 having a space configured to be filled with a raw material, first and second rods 140a and 140b extending from above the body 110 to an inner region of the body 110 so as to be disposed in the body, and first and second valves 180a and 180b connected to the first and second rods 140a and 140b, respectively, the first and second valves being disposed under the first and second rods 140a and 140b, respectively, so as to open and close a lower part of the body 110. A partition 160 configured to divide the body 110 into at least two regions in a longitudinal direction may be provided in the body 110.

Each of the body 110 and the first and second valves 180a and 180b may include quartz glass, which exhibits high corrosion resistance, durability, and purity. The body 110 may be open at an upper surface and a lower surface thereof, and may have a space configured to be filled with a raw material (not shown) therein. For example, the body may have a cylindrical shape. The open upper surface of the body 110 may be closed by a cover 150, and the open lower surface of the body may be closed by the first and second valves 180a and 180b. The cover 150 may be provided in one or in plural, and may have any of various shapes, such as a cross shape, in addition to a bar shape.

The first and second rods 140a and 140b may be connected to a seed chuck 120 disposed above the body 110. At this time, a stopper 130 may be provided at upper regions of the first and second rods 140a and 140b. The stopper 130 may protrude relative to the first and second rods 140a and 140b in a lateral direction to stop operation of the driving unit when contacting the cover 150 provided above the body 110.

When the raw material supply unit 100 of FIG. 3 is introduced into the single-crystal silicon ingot growth apparatus of FIG. 2, the first and second rods 140a and 140b may be connected to the first and second connection ends 175a and 175b described with reference to FIG. 2, and may be inserted into the body 110 of the raw material supply unit 100. For example, each of the first and second rods 140a and 140b may be made of a metal alloy including molybdenum, which exhibits high corrosion resistance and heat resistance, or tungsten, which is resistant to heat and pressure and exhibits high hardness.

Each of the first and second valves 180a and 180b may form a part of a conical shape. Here, the conical shape may mean a cone having a circular lower surface.

The first and second valves 180a and 180b may include first and second bottom surfaces, first and second inclined surfaces, and first and second inside surfaces, the first and second inclined surfaces may be inclined from a region adjacent to the center of the body in the lateral direction (a region shown as the partition in FIG. 3) toward the first and second bottom surfaces, and the first and second rods 140a and 140b and the first and second valves 180a and 180b may be connected to each other in upper regions of the first and second inclined surfaces. In addition, the first and second rods 140*a* and 140*b* may be disposed on the same line as the first and second inside surfaces in the longitudinal direction.

Figure 4A:
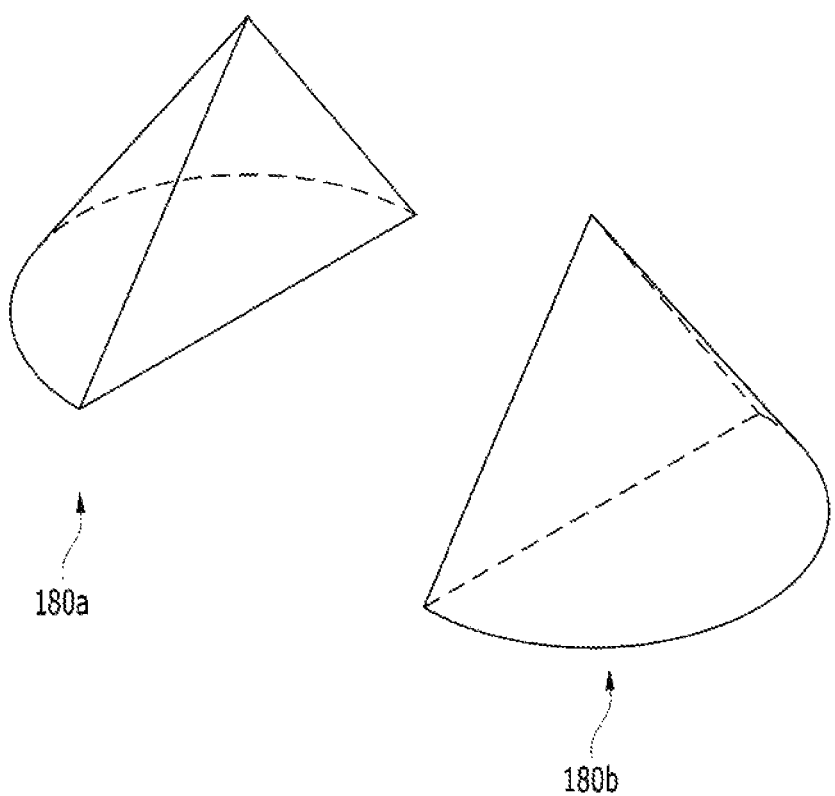
FIG. 4A is a perspective view of first and second valves of the embodiment of FIG. 3.

FIG. 4A is a perspective view of the first and second valves of this embodiment. When the first and second valves 180*a* and 180*b* are coupled to each other, a conical shape may be formed. When the first and second valves 180*a* and 180*b* have the same shape, polysilicon may be evenly injected into the crucible in a polysilicon injection process, a description of which will follow.

Figure 4B:
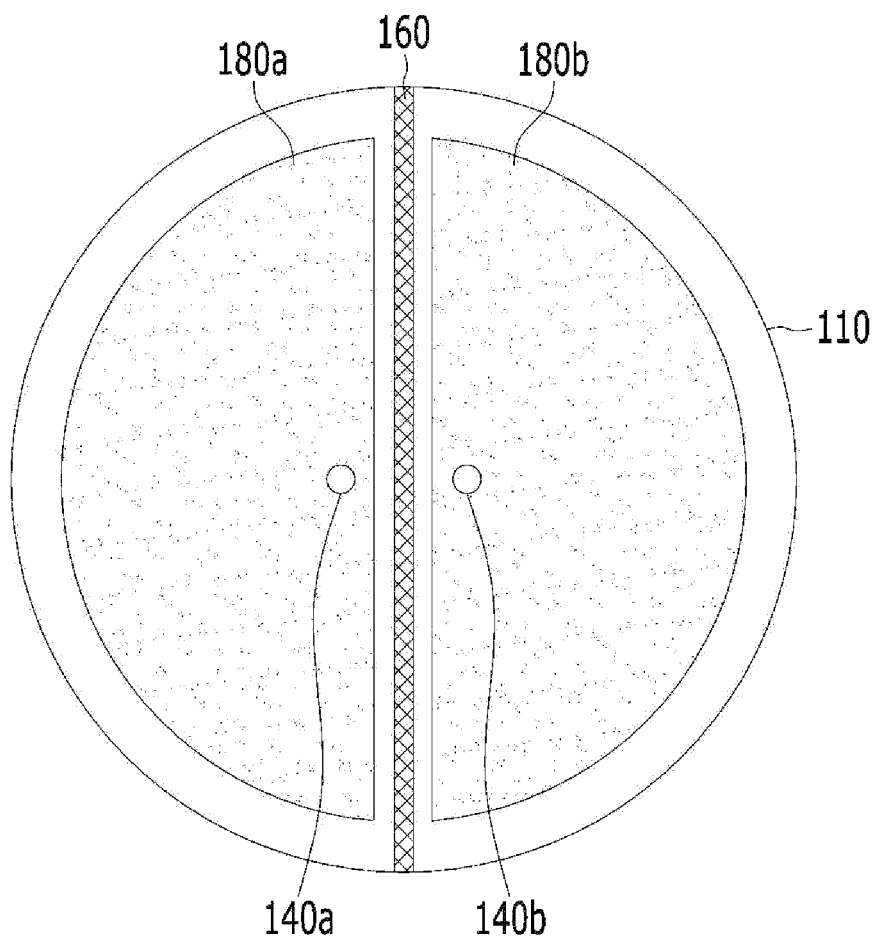
FIG. 4B is a cross sectional view of a body of the raw material supply unit in which the first and second valves of FIG. 4A are disposed.

FIG. 4B is a cross sectional view of the body of the raw material supply unit in which the first and second valves of FIG. 4A are disposed.

On the assumption that the partition 160 is disposed to divide the body 110 of the raw material supply unit 100 into two equal parts and regions divided by the partition 160 are first and second regions, the first and second valves 180*a* and 180*b* may be disposed in the first and second regions, respectively, and the first and second valves 180*a* and 180*b* may be connected to the first and second rods 140*a* and 140*b*, respectively.

Figure 5A:
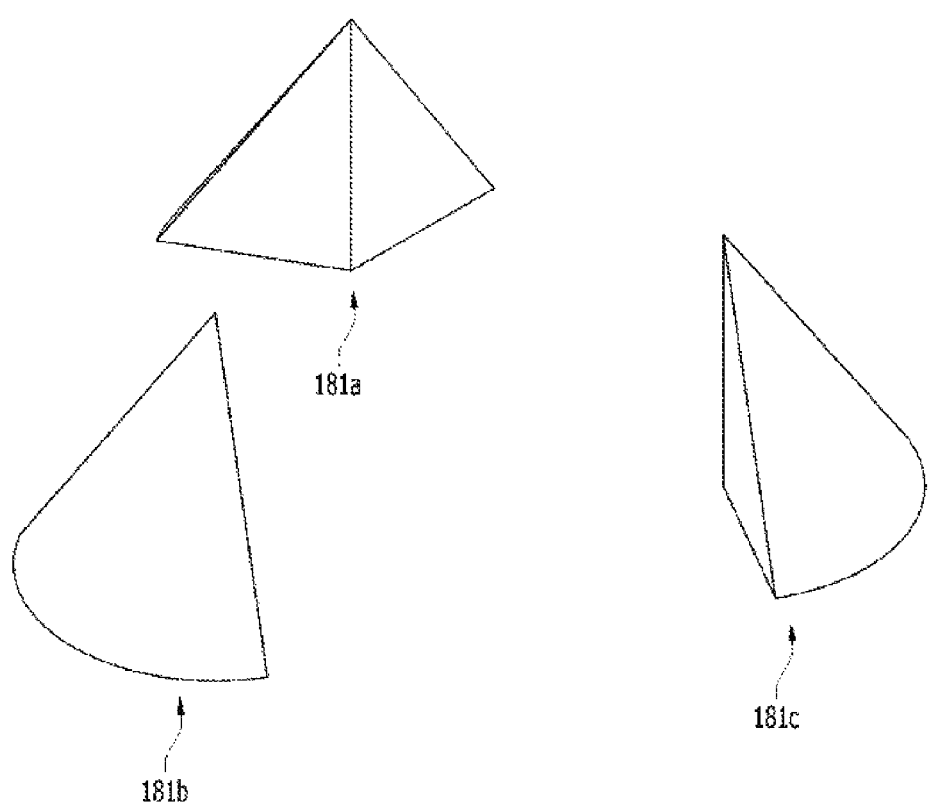
FIG. 5A is a perspective view of first, second, and third valves according to another embodiment.
Figure 5B:
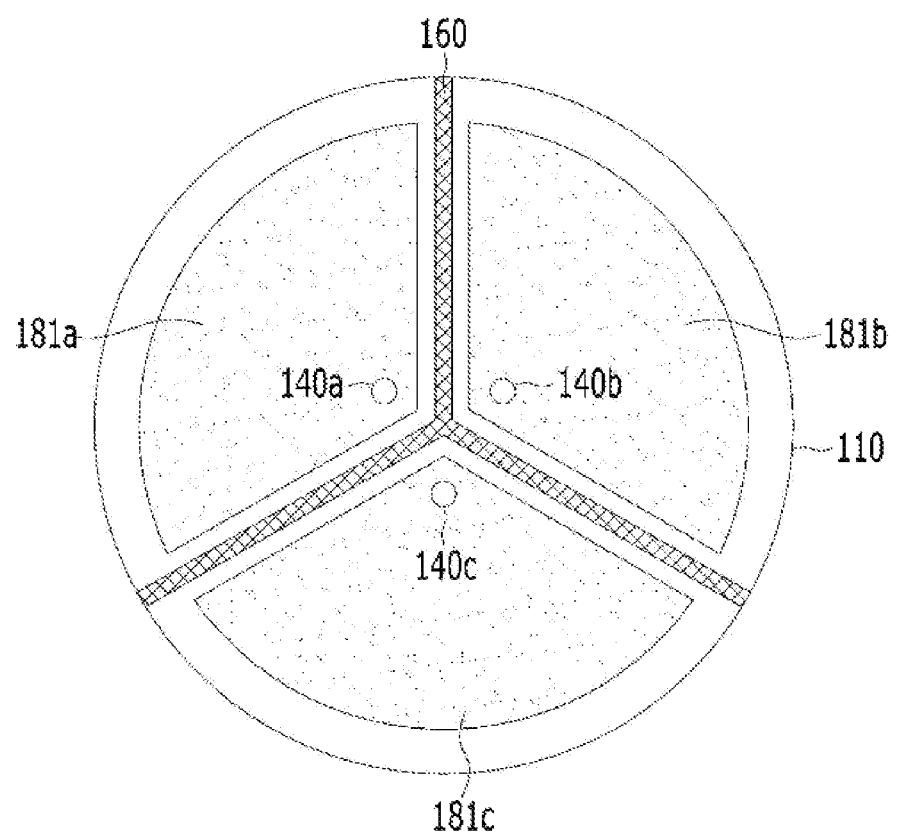
FIG. 5B is a cross sectional view of the body of the raw material supply unit in which the first to third valves of FIG. 5A are disposed.

FIG. 5A is a perspective view of first, second, and third valves according to another embodiment, and FIG. 5B is a cross sectional view of the body of the raw material supply unit in which the first to third valves of FIG. 5A are disposed.

Each of the first to third valves 181*a* to 181*c* may form a part of a conical shape, and when the first to third valves 181*a* to 181*c* are coupled to each other, a conical shape may be formed. When the first to third valves 181*a* to 181*c* have the same shape, polysilicon may be evenly injected into the crucible in a polysilicon injection process, a description of which will follow.

On the assumption that the partition 160 is disposed to divide the body 110 of the raw material supply unit 100 into three equal parts and regions divided by the partition 160 are first to third regions, the first, second, and third valves 181*a*, 181*b*, and 181*c* may be disposed in the first region, the second region, and the third region, respectively, and the first, second, and third valves 181*a*, 181*b*, and 181*c* may be connected to first, second, and third rods 140*a*, 140*b*, and 140*c*, respectively.

Although not shown, the first, second, and third rods 140*a*, 140*b*, and 140*c* may be connected to first, second, and third fixing ends, respectively, and the first, second, and third fixing ends may be connected to first, second, and third rotary drums, respectively.

Figure 6A:
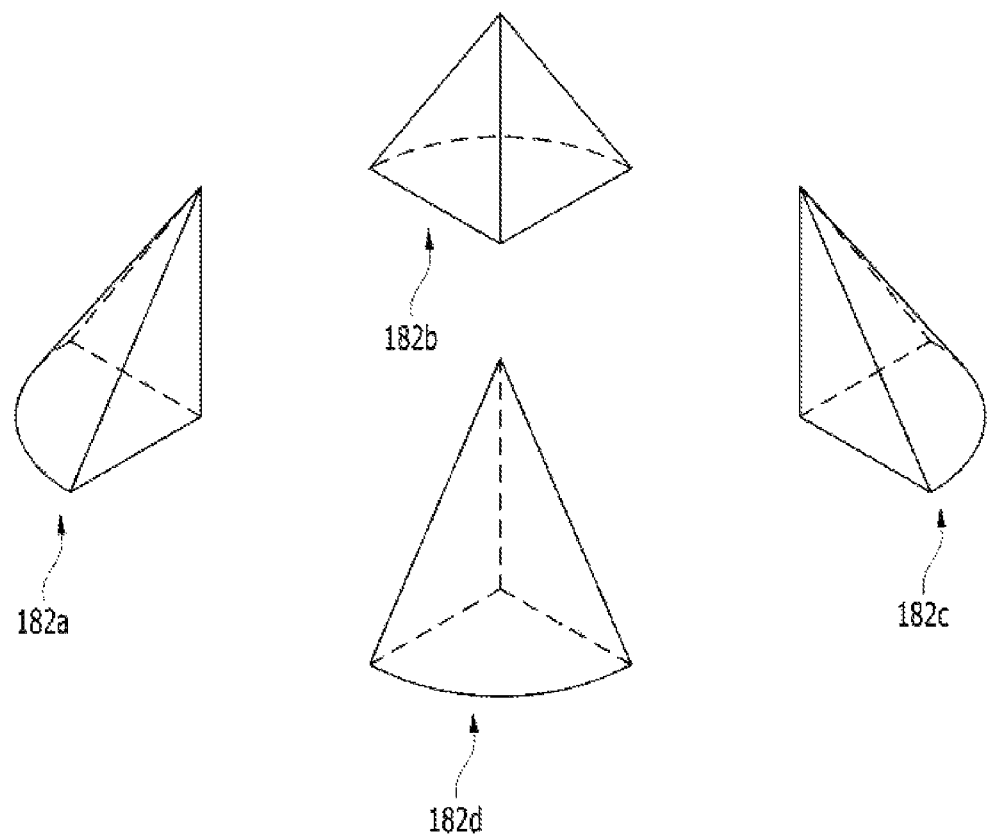
FIG. 6A is a perspective view of first, second, third, and fourth valves according to another embodiment.
Figure 6B:
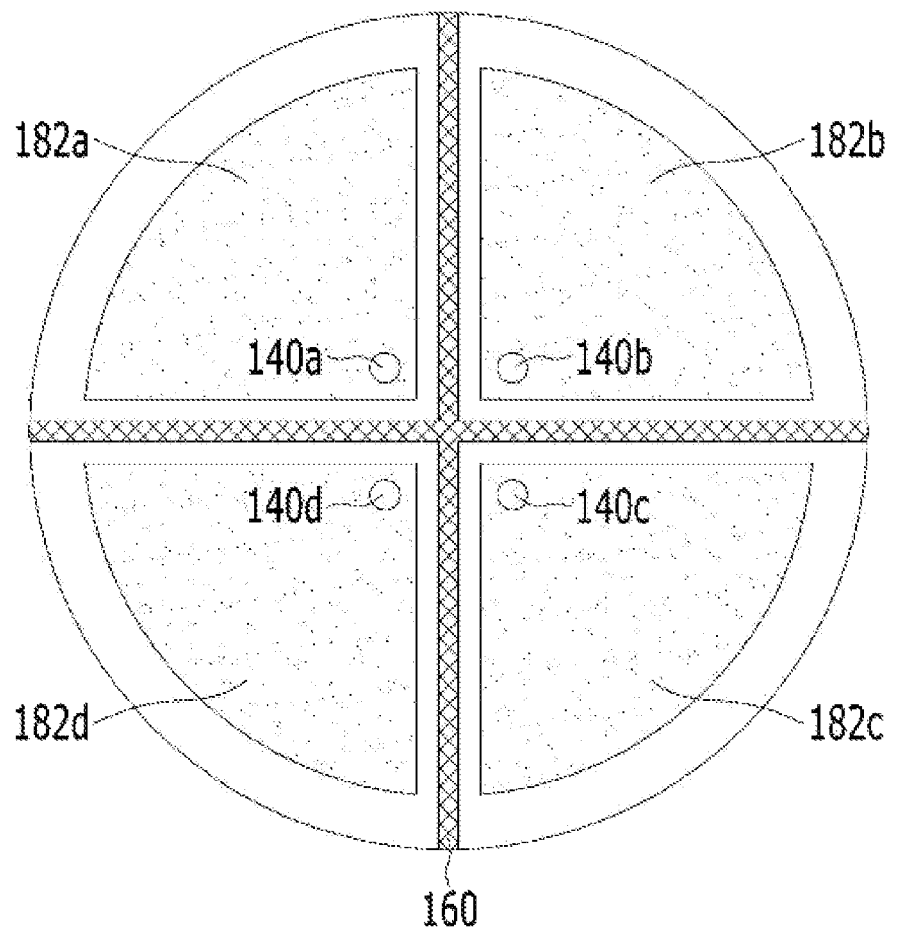
FIG. 6B is a cross sectional view of the body of the raw material supply unit in which the first to fourth valves of FIG. 6A are disposed.

FIG. 6A is a perspective view of first, second, third, and fourth valves according to another embodiment, and FIG. 6B is a cross sectional view of the body of the raw material supply unit in which the first to fourth valves of FIG. 6A are disposed.

Each of the first to fourth valves 182*a* to 182*d* may form a part of a conical shape, and when the first to fourth valves 182*a* to 182*d* are coupled to each other, a conical shape may be formed. When the first to fourth valves 182*a* to 182*d* have the same shape, polysilicon may be evenly injected into the crucible in a polysilicon injection process, a description of which will follow.

On the assumption that the partition 160 is disposed to divide the body 110 of the raw material supply unit 100 into four equal parts and regions divided by the partition 160 are first to fourth regions, the first to fourth valves 182*a* to 182*d* may be disposed in the first to fourth regions, respectively, and the first to fourth valves 182*a* to 182*d* may be connected to first to fourth rods 140*a* to 140*d*, respectively.

In FIG. 6B, the body 110 may be divided into the first to fourth regions in the lateral direction by the partition 160, the first valve 182*a* and the third valve 182*c* may be provided in the first region and the third region, which face each other, respectively, and the second valve 182*b* and the fourth valve 182*d* may be provided in the second region and the fourth region, which are disposed between the first region and the third region so as to face each other, respectively.

At this time, a first rod may be connected to the first valve 182*a*, a first fixing end connected to the first rod may be wound around a first rotary drum, a third rod may be connected to the third valve 182*c*, and a third fixing end connected to the third rod may be wound around a third rotary drum. At this time, the first rotary drum and the third rotary drum may equally move the first fixing end and the third fixing end upwards and downwards. Since polysilicon is supplied from the facing regions of the body of the raw material supply unit in a direction toward the crucible, therefore, the raw material supply unit may be balanced so as not to be biased to one side.

In addition, a second rod may be connected to the second valve 182*b*, a second fixing end connected to the second rod may be wound around a second rotary drum, a fourth rod may be connected to the fourth valve 182*d*, and a fourth fixing end connected to the fourth rod may be wound around a fourth rotary drum. At this time, the second rotary drum and the fourth rotary drum may equally move the second fixing end and the fourth fixing end upwards and downwards.

Figure 7:
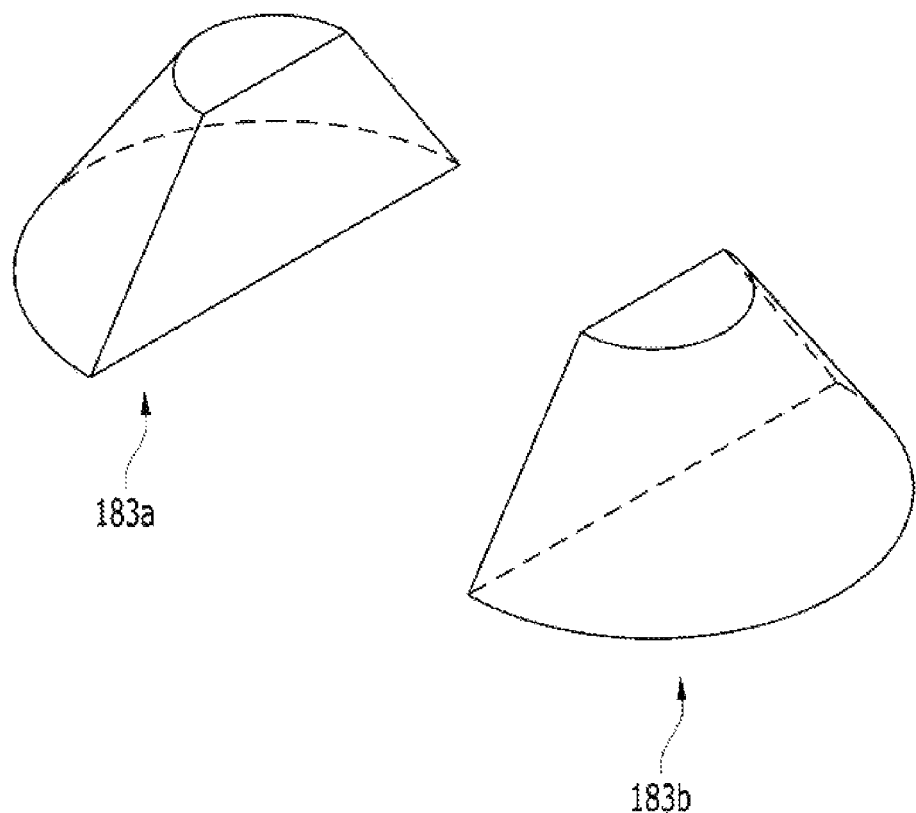
FIG. 7 is a perspective view of first and second valves according to a further embodiment.

FIG. 7 is a perspective view of first and second valves according to a further embodiment.

The first and second valves 183*a* and 183*b* according to this embodiment are similar to the first and second valves 180*a* and 180*b* of FIGS. 4A and 4B except that each of first and second valves has an upper surface.

That is, each of first and second valves 183*a* and 183*b* includes a bottom surface, an upper surface, an inclined surface configured to connect outsides of the bottom surface and the upper surface to each other, and an inside surface configured to connect insides of the bottom surface and the upper surface to each other. At this time, the area of the upper surface may be less than the width of the bottom surface, and first and second rod may be connected to the upper surfaces of the first and second valves 183*a* and 183*b*, respectively.

Each of the bottom surface and the upper surface of each of the first and second valves 183*a* and 183*b* may have a semicircular shape, and the middle of a side of the semicircular shape may be disposed adjacent to the center of the body of the raw material supply unit in the lateral direction. When three or more valves are provided, each of the bottom surface and the upper surface of each valve may have a fan shape, and a vertex of the fan shape may be disposed adjacent to the center of the body of the raw material supply unit in the lateral direction.

In the above embodiments, two to four valves are provided. At this time, the partition may divide the body into two to four regions in the lateral direction, and one valve may be disposed in one region. Also, in each embodiment, at least two valves may be disposed in symmetry with respect to the center of the body in the lateral direction. In particular, when the bottom surfaces of the valves have the same area, polysilicon may be evenly supplied to the entire region of the crucible.

In FIG. 3, for example, when the cross section of the body 110 is circular, the partition 160 may divide the section of the body 110 into semicircular parts. In the embodiment shown in FIGS. 5A and 5B, the partition may divide the cross section of the body 110 into three equal parts. In the embodiment shown in FIGS. 6A and 6B, the partition may divide the cross section of the body 110 into four equal parts.

In this embodiment and an embodiment that will be described below, if the partition is omitted from the raw material supply unit, the construction of the raw material supply unit may be complicated, and a stability-related problem may occur during driving and use of the raw material supply unit.

FIGS. 8A to 8E are views showing an embodiment of a raw material supply method according to the present disclosure.

Figure 8A:
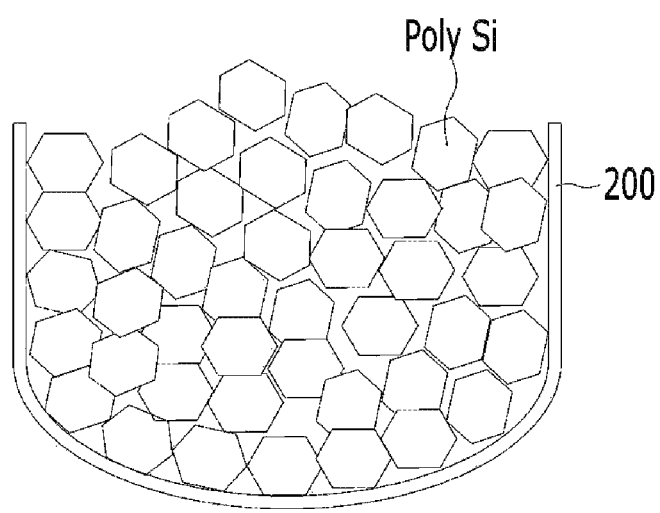
FIGS. 8A to 8E are views showing an embodiment of a raw material supply method according to the present disclosure.
Figure 8B:
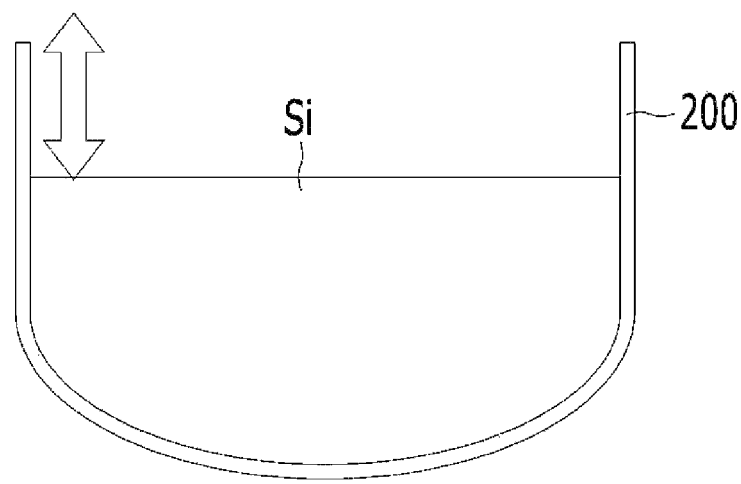

First, as shown in FIGS. 8A and 8B, the crucible 200 is filled with polysilicon, which is a raw material, and the polysilicon is melted. When the polysilicon is melted, gaps between solid-state polysilicon particles may disappear, whereby the height of the silicon melt in FIG. 8B may be lower than the height of the polysilicon in FIG. 8A.

Figure 8C:
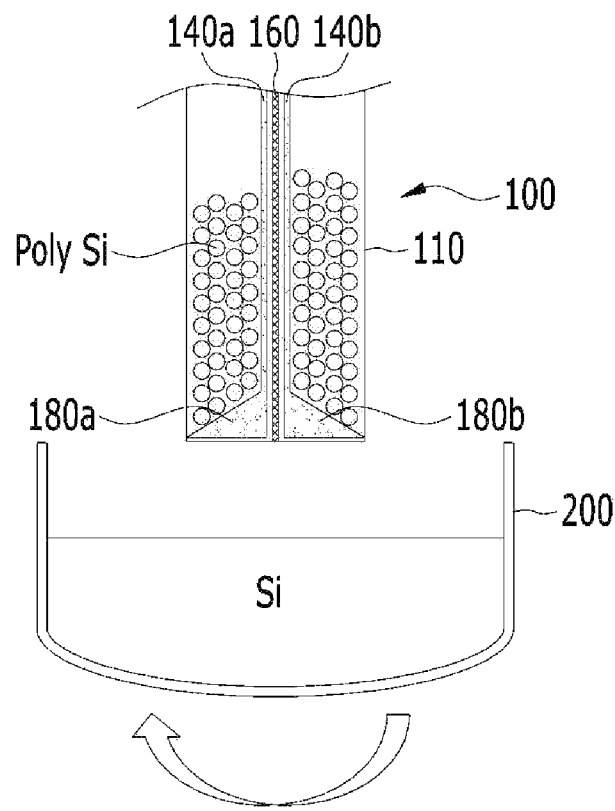

Subsequently, as shown in FIG. 8C, the raw material supply unit 100 having polysilicon injected thereinto is disposed above the crucible 200 containing the silicon melt. At this time, polysilicon may be injected into the raw material supply unit 100 from outside a process chamber (not shown), and the polysilicon may be moved into the process chamber. At this time, the raw material supply unit 100 may be the raw material supply unit according to the embodiment shown in FIG. 3.

Figure 8D:
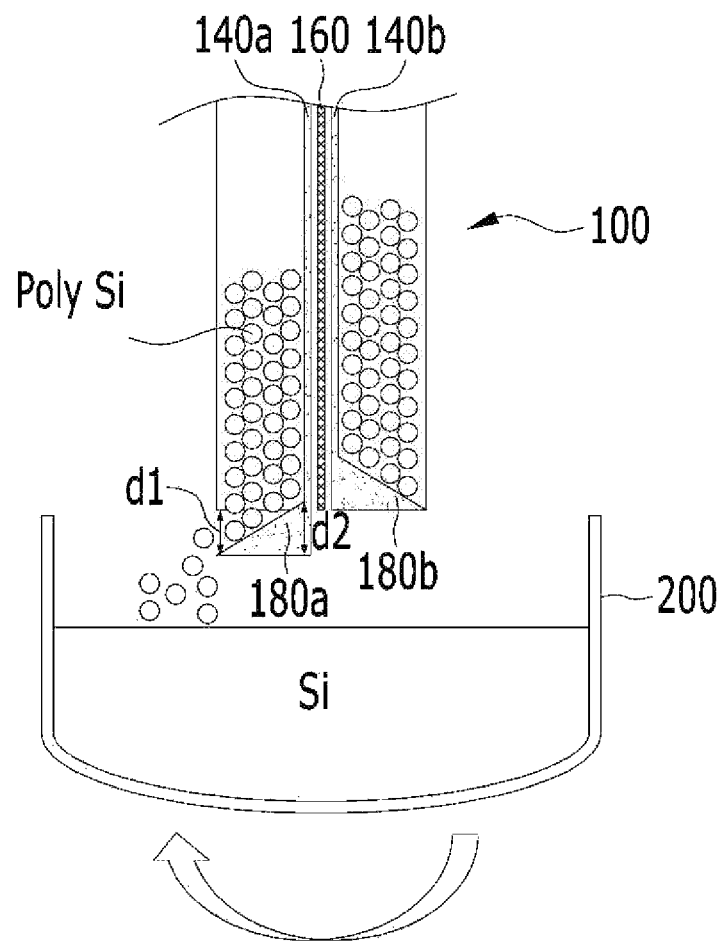

Subsequently, as shown in FIG. 8D, when the first valve 180a of the raw material supply unit 100 is moved downwards, the polysilicon (poly Si) may be supplied from the first region of the lower surface of the raw material supply unit 100 in the direction toward the crucible 200. At this time, the lower surface of the first valve 180a may be spaced apart from the lower surface of the body 110 of the raw material supply unit 100 by a first distance d1, and the height of the first valve 180a may be a second distance d2. The first distance d1 may be 30 to 70 mm, and the second distance d2 may be 100 to 200 mm. If the first distance d1 is greater than 70 mm, polysilicon may drop too fast into the crucible 200, whereby the silicon melt (Si melt) may splash at the surface thereof. If the first distance d1 is less than 30 mm, a space between the first valve 180a and the body 110 is too narrow, whereby polysilicon may not be smoothly supplied.

Figure 8E:
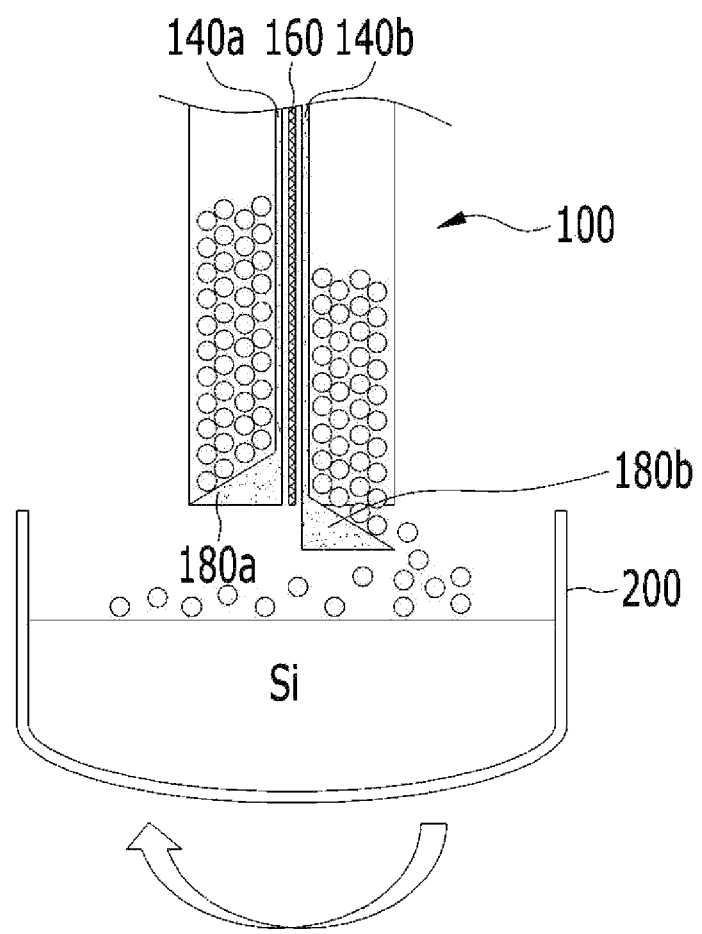

Subsequently, when the second valve 180b of the raw material supply unit 100 is moved downwards, as shown in FIG. 8E, the polysilicon may be supplied from the second region of the lower surface of the raw material supply unit 100 in the direction toward the crucible 200. In FIG. 8E, the first valve 180a is shown as being located higher than in FIG. 8D. However, the first valve 180a may be located at the same position as in FIG. 8D.

In the steps shown in FIGS. 8D and 8E, the crucible 200 may be continuously rotated, and polysilicon further supplied to the crucible 200 may be melted.

As previously described, the first region and the second region of the lower surface of the raw material supply unit 100 shown may be provided in symmetry with respect to the center of the lower surface of the raw material supply unit 100 and thus may have the same area. In this construction, the same amount of polysilicon may be supplied to the crucible 200 at the same speed in the processes shown in FIGS. 8D and 8E. To this end, in FIG. 8C, the spaces of the raw material supply unit 100 above the first valve 180a and the second valve 180b may be filled with polysilicon having the same weight or volume. The same area, the same speed, the same weight, and the same volume do not mean mathematically exactly the same.

Since the amount of polysilicon supplied to the crucible 200 is larger in the process shown in FIG. 8E than in the process shown in FIG. 8D, the surface of the silicon melt may rise even though the polysilicon is completely melted. In the process of FIG. 8E, therefore, the crucible 200 may be moved downwards farther than in the process of FIG. 8D in order to prevent splashing of the silicon melt (Si melt) at the surface thereof.

Raw material supply methods according to other embodiments may use the raw material supply unit configured such that the inner region of the body is divided into three equal parts in the lateral direction, as shown in FIGS. 5A and 5B, or may use the raw material supply unit configured such that the inner region of the body is divided into four equal parts in the lateral direction, as shown in FIGS. 6A and 6B.

When polysilicon is supplied to the crucible using the raw material supply unit configured such that the inner region of the body is divided into three equal parts in the lateral direction, the first to third valves may be sequentially moved downwards, and the polysilicon may be supplied to the crucible through the regions corresponding thereto.

When polysilicon is supplied to the crucible using the raw material supply unit configured such that the inner region of the body is divided into four equal parts in the lateral direction, as shown in FIGS. 6A and 6B, the lower surface of the raw material supply unit may be divided into a first region and a third region that face each other in symmetry with respect to the center thereof in the lateral direction and a second region and a fourth region that face each other in symmetry with respect to the center thereof. At this time, each of the second region and the fourth region may be disposed between the first region and the third region.

In a polysilicon supply process, first, the first valve and the third valve may be moved downwards together with each other, whereby polysilicon may be supplied to the crucible through the first region and the third region, and then the second valve and the fourth valve may be moved downwards together with each other, whereby polysilicon may be supplied to the crucible through the second region and the fourth region.

In the raw material supply unit, the single-crystal silicon ingot growth apparatus including the same, and the raw material supply method, a raw material may be supplied through some regions and then the raw material may be supplied through other regions using a body having a larger volume than before, whereby the raw material supply unit may not be replaced during supply of the raw material or the raw material supply unit may not be refilled with a raw material, and therefore a raw material supply process may be simplified and process time may be shortened.

When the silicon melt is sufficiently prepared in the crucible through the above process, a single-crystal silicon ingot may be grown using a Czochralski (CZ) method, a grinding process of grinding an outer circumferential surface of the grown single-crystal silicon ingot, a slicing process of slicing the single-crystal silicon ingot in the form of a wafer, a lapping process of polishing the wafer to a desired thickness, thereby improving flatness thereof, an etching process of removing a damaged layer in the wafer, and a polishing process of polishing the surface of the wafer, thereby improving flatness thereof, may be performed, and a cleaning process of removing contaminants from the surface of the wafer, an oxide film formation process, and a rapid thermal process may be performed to manufacture a silicon wafer.

Although embodiments have been described with reference to the drawings, it should be understood that the present disclosure is not limited to the above embodiments and various modifications and alterations are possible by those skilled in the art to which the present disclosure pertains.

Therefore, the scope of the present disclosure is not defined by the embodiments described above but is defined by the accompanying claims and equivalents thereto.

INDUSTRIAL APPLICABILITY

A raw material supply unit according to an embodiment and a single-crystal silicon ingot growth apparatus and method including the same may be used to manufacture a silicon substrate used to manufacture a semiconductor device, a solar cell, etc.

The invention claimed is:

1. A raw material supply unit comprising:
a body having a space configured to be filled with a raw material;
a partition configured to divide the body into at least two regions in a longitudinal direction;
at least two valves provided in the regions of the body divided by the partition, the at least two valves being configured to open and close a lower part of the body; and
a driving unit configured to independently move the at least two valves in an upward-downward direction,
wherein the driving unit comprises rods connected to the respective valves and rotary drums provided above the rods,
wherein each of the valves forms a part of a conical shape, and each of the rods is connected to an upper part of a corresponding one of the valves, and
wherein each valve is separately provided at the lower part of a corresponding one of the different at least two regions.

2. The raw material supply unit according to claim 1, wherein
a region in which each of the rods and a corresponding one of the at least two valves are connected to each other is adjacent to a center of the body in a lateral direction, and
each of the at least two valves comprises a bottom surface and an inclined surface, the inclined surface being inclined from the region adjacent to the center of the body in the lateral direction toward the bottom surface of the at least two valves, the region in which each of the rods and a corresponding one of the at least two valves are connected to each other being an upper region of the inclined surface.

3. The raw material supply unit according to claim 1, wherein
a region in which each of the rods and a corresponding one of the at least two valves are connected to each other is adjacent to a center of the body in a lateral direction,
the at least two valves comprises a bottom surface, an upper surface, an inclined surface configured to connect outsides of the bottom surface and the upper surface to each other, and an inside surface configured to connect insides of the bottom surface and the upper surface to each other, and
an area of the upper surface of the at least two valves is less than a width of the bottom surface, each of the rods being connected to the upper surface of the at least two valves.

4. The raw material supply unit according to claim 1, wherein the at least two valves are disposed in symmetry with respect to a center of the body in a lateral direction.

5. The raw material supply unit according to claim 4, wherein
the partition divides the body into four regions, the at least two valves includes four valves,
a first valve and a third valve are provided in a first region and a third region that face each other, respectively, and
a second valve and a fourth valve are provided in a second region and a fourth region that are disposed between the first region and the third region so as to face each other, respectively.

* * * * *